United States Patent
Mao

(10) Patent No.: US 10,251,300 B1
(45) Date of Patent: Apr. 2, 2019

(54) TRAY MECHANISM AND SERVER APPARATUS THEREOF

(71) Applicant: Wistron Corporation, New Taipei (TW)

(72) Inventor: Zhong-Hui Mao, New Taipei (TW)

(73) Assignee: Wistron Corporation, New Taipei (TW)

(*) Notice: Subject to any disclaimer, the term of this patent is extended or adjusted under 35 U.S.C. 154(b) by 0 days.

(21) Appl. No.: 16/053,770

(22) Filed: Aug. 2, 2018

(30) Foreign Application Priority Data

Jun. 21, 2018 (CN) .......................... 2018 1 0644606

(51) Int. Cl.
*H05K 7/14* (2006.01)
(52) U.S. Cl.
CPC .................................. *H05K 7/1489* (2013.01)
(58) Field of Classification Search
None
See application file for complete search history.

(56) References Cited

U.S. PATENT DOCUMENTS

| | | | | |
|---|---|---|---|---|
| 9,122,458 B2* | 9/2015 | Yu | ........................... | G06F 1/185 |
| 9,674,978 B2* | 6/2017 | Wu | ........................ | G06F 1/185 |
| 9,717,158 B2* | 7/2017 | Della Fiora | .......... | H05K 7/1487 |
| 9,911,464 B2* | 3/2018 | Jau | .......................... | G06F 1/187 |
| 10,045,458 B2* | 8/2018 | Yu | ....................... | H05K 7/1489 |
| 10,104,803 B1* | 10/2018 | Lin | ......................... | H05K 7/16 |
| 2010/0033924 A1* | 2/2010 | Olesiewicz | ............. | G06F 1/185 361/679.57 |

* cited by examiner

*Primary Examiner* — Xanthia C Cunningham
(74) *Attorney, Agent, or Firm* — Winston Hsu

(57) ABSTRACT

A tray mechanism is configured to mount an electronic device on a mainboard device. The mainboard device includes a casing and a mainboard disposed in the casing. A casing side-plate of the casing has a pin. The tray mechanism includes a tray and first and second sliding sheets. The tray has a bottom plate and a tray side-plate corresponding to the casing side-plate. The electronic device is disposed on the bottom plate. The first and second sliding sheets are slidably arranged on the tray side-plate and have first and second oblique slots intersecting with each other. First and second bottom end portions are formed at sides of the first and second oblique slots away from the bottom plate respectively. When the first and second sliding sheets are located at a mounting position, the pin penetrates through the first and second bottom end portions simultaneously.

20 Claims, 11 Drawing Sheets

TRAY MECHANISM AND SERVER APPARATUS THEREOF

BACKGROUND OF THE INVENTION

1. Field of the Invention

The present disclosure relates to a tray mechanism and a server apparatus thereof, and more specifically, to a tray mechanism utilizing sliding sheets on a tray side-plate to mount an electronic device on a mainboard and a server apparatus thereof.

2. Description of the Prior Art

In general, in a conventional stacked server assembly process, mainboards are mounted in a stacked arrangement. That is, a mainboard is usually stacked above another mainboard mounted in a server casing, and connectors on the two stacked mainboards are physically connected to each other to establish electrical connection between the two stacked mainboards. As such, amount of mainboard components (e.g. video cards or central processing units) mounted into a server could be increased, so as to efficiently improve the computational performance and configuration flexibility of the server.

A conventional stacked server assembly method is to mount an upper mainboard on a tray and then mount the tray having the upper mainboard into a server casing from a top of the server casing. During this process, connectors on the upper mainboard need to be inserted into connectors on a lower mainboard of the server casing tightly. However, since the aforesaid connectors (e.g. heavy duty connectors or power connectors) needs to have a great number of pins for satisfying high power and high data transmission requirements of the mainboards, it is not easy to plug or unplug the aforesaid connectors, which may cause a great inconvenience to users in assembly and disassembly of the mainboards.

SUMMARY OF THE INVENTION

The present disclosure provides a tray mechanism for mounting at least one electronic device on a mainboard device. The mainboard device includes a mainboard and a casing. The mainboard is disposed in the casing. A casing side-plate of the casing has at least one pin. The tray mechanism includes a tray, a first sliding sheet, and a second sliding sheet. The tray has a bottom plate and a tray side-plate corresponding to the casing side-plate. The at least one electronic device is disposed on the bottom plate. The first sliding sheet is slidably disposed on the tray side-plate. A first oblique slot is formed on the first sliding sheet corresponding to the at least one pin. A first bottom end portion is formed at a side of the first oblique slot away from the bottom plate. The second sliding sheet is slidably disposed on the tray side-plate. A second oblique slot is formed on the second sliding sheet corresponding to the at least one pin and intersects with the first oblique slot. A second bottom end portion is formed at a side of the second oblique slot away from the bottom plate. When the first and second sliding sheets are located at an assembling position, the at least one pin penetrates through the first and second bottom end portions simultaneously.

The present disclosure further provides a tray mechanism. The tray mechanism includes a tray, a first sliding sheet, and a second sliding sheet. The tray has a bottom plate and a tray side-plate. At least one electronic device is disposed on the bottom plate. The first sliding sheet is slidably disposed on the tray side-plate. A first oblique slot is formed on the first sliding sheet. A first bottom end portion is formed at a side of the first oblique slot away from the bottom plate. The second sliding sheet is slidably disposed on the tray side-plate. A second oblique slot is formed on the second sliding sheet corresponding to the first sliding slot and intersects with the first oblique slot. A second bottom end portion is formed at a side of the second oblique slot away from the bottom plate. When the first and second sliding sheets are located at an assembling position, the first bottom end portion is overlapped with the second bottom end portion.

The present disclosure further provides a server apparatus. The server apparatus includes a mainboard device, at least one electronic device, and a tray mechanism. The mainboard device includes a mainboard and a casing. The mainboard is disposed in the casing. A casing side-plate of the casing has at least one pin. The tray mechanism includes a tray, a first sliding sheet, and a second sliding sheet. The tray has a bottom plate and a tray side-plate corresponding to the casing side-plate. The at least one electronic device is disposed on the bottom plate. The first sliding sheet is slidably disposed on the tray side-plate. A first oblique slot is formed on the first sliding sheet corresponding to the at least one pin. A first bottom end portion is formed at a side of the first oblique slot away from the bottom plate. The second sliding sheet is slidably disposed on the tray side-plate. A second oblique slot is formed on the second sliding sheet corresponding to the at least one pin and intersects with the first oblique slot. A second bottom end portion is formed at a side of the second oblique slot away from the bottom plate. When the first and second sliding sheets are located at an assembling position, the at least one pin penetrates through the first and second bottom end portions simultaneously.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
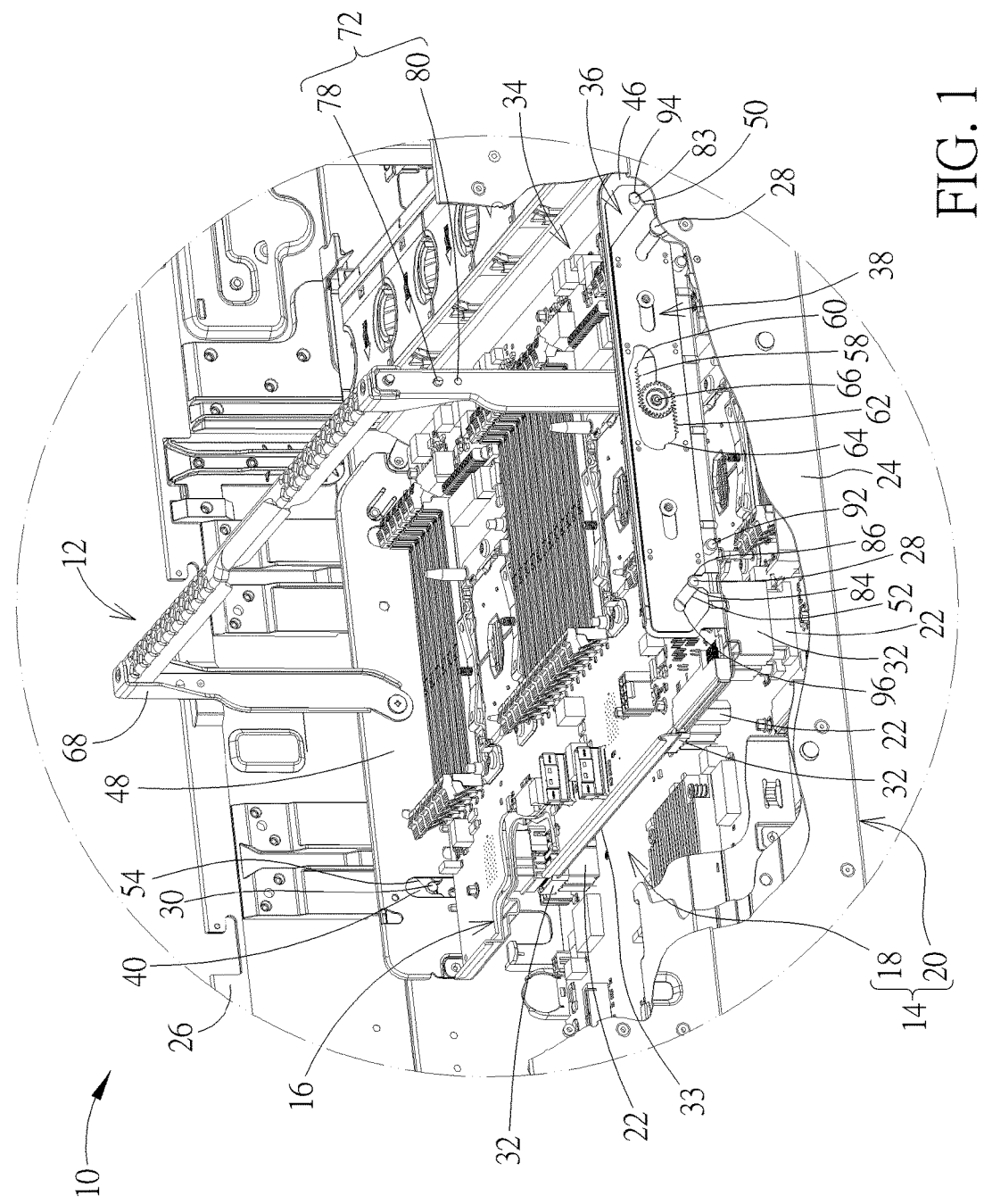
FIG. 1 is a partial enlarged diagram of a server apparatus when a tray mechanism is mounted into the mainboard device according to an embodiment of the present disclosure.
Figure 2:
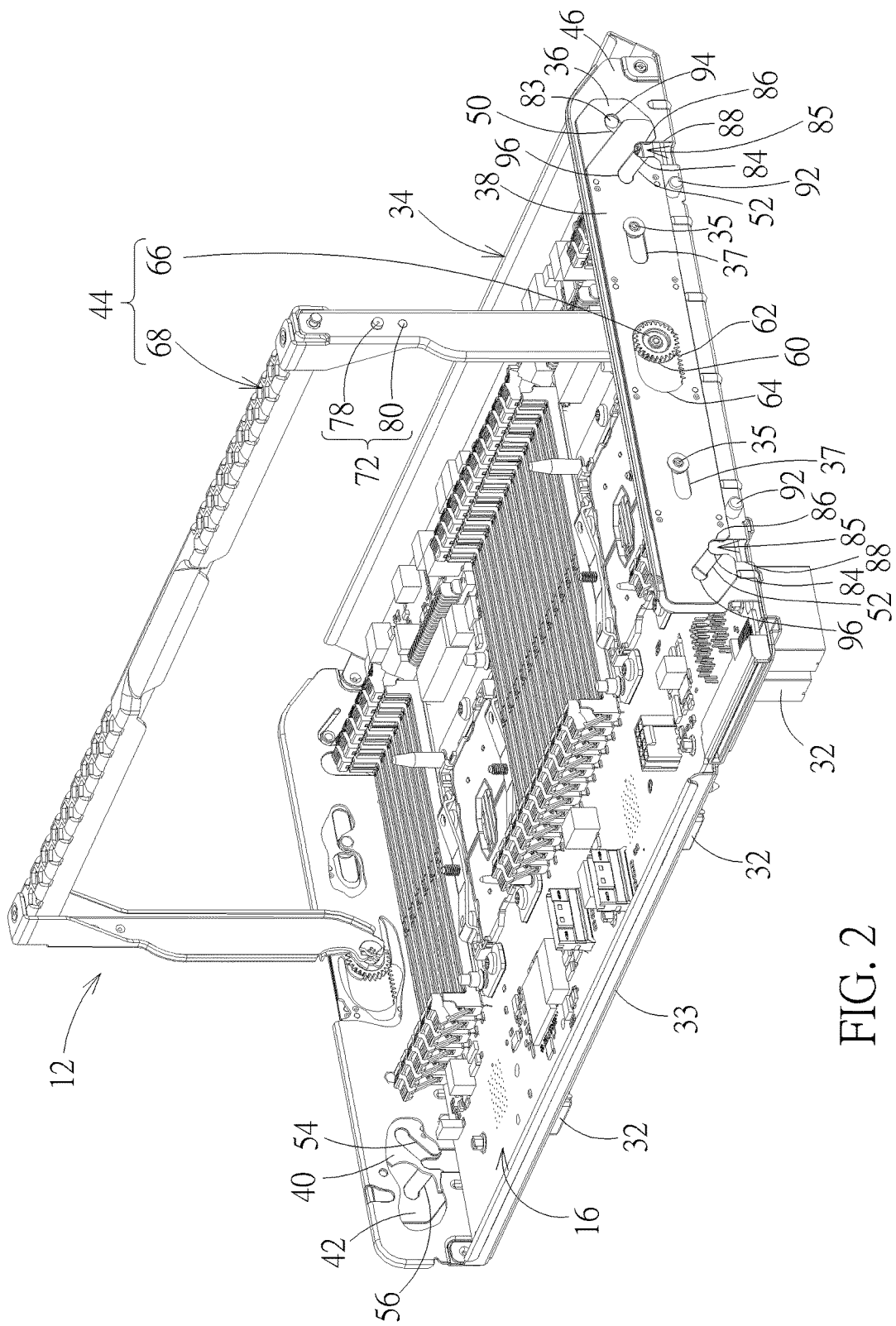
FIG. 2 is an enlarged diagram of the tray mechanism in FIG. 1.
Figure 3:
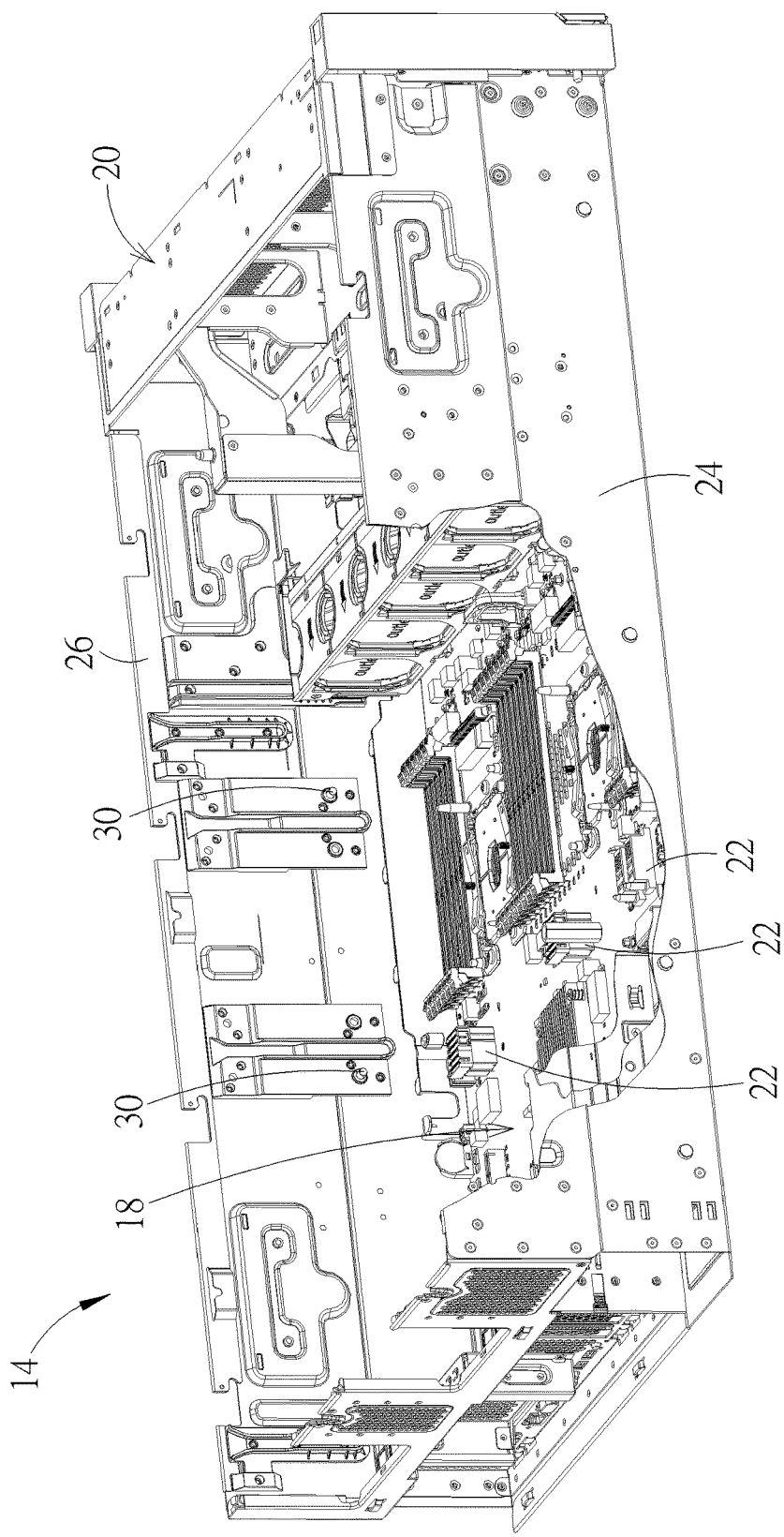
FIG. 3 is an enlarged diagram of the mainboard device in FIG. 1.
Figure 4:
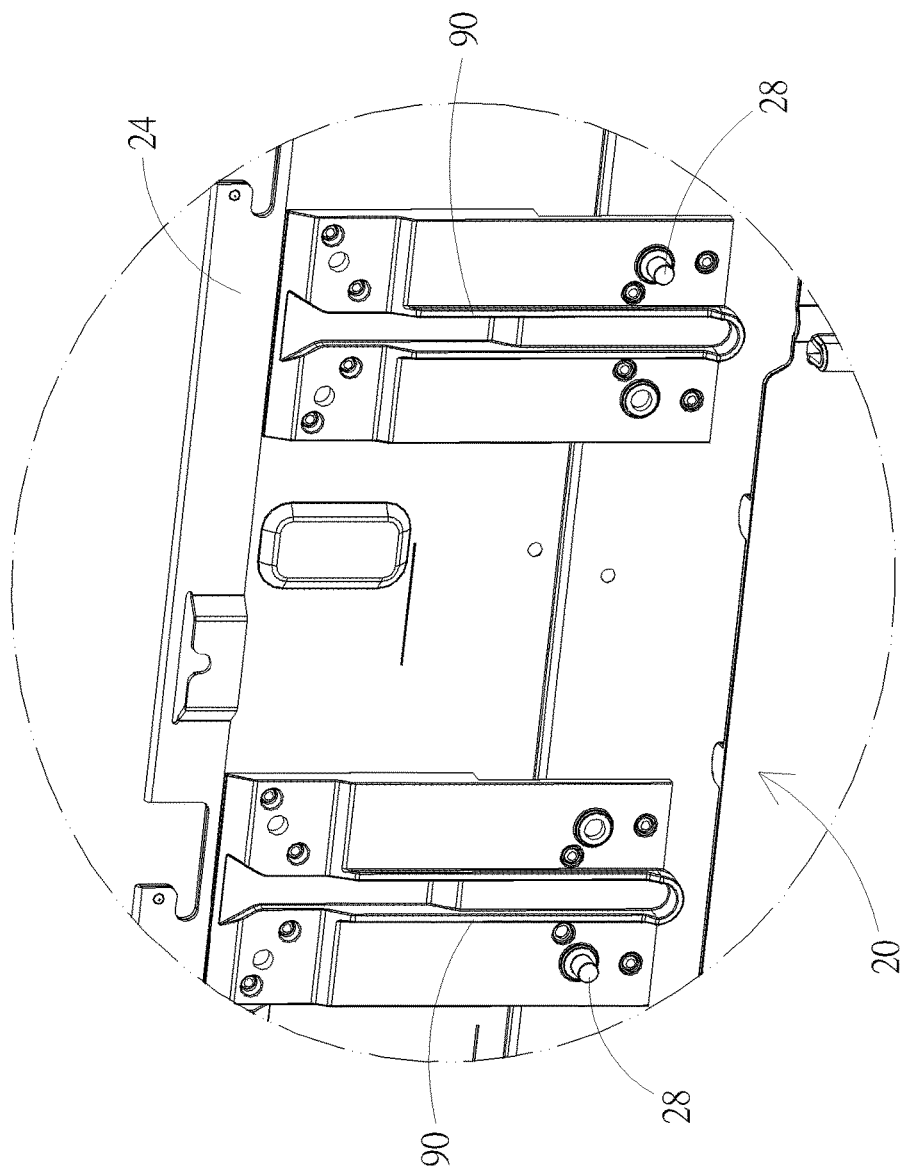
FIG. 4 is a partial enlarged diagram of a casing in FIG. 3 from another viewing angle.

As shown in FIGS. 1-5, a server apparatus 10 includes a tray mechanism 12, a mainboard device 14, and at least one electronic device (for example, as shown in FIG. 1, two electronic devices are accommodated, but the present disclosure is not limited thereto). The mainboard device 14 includes a mainboard 18 and a casing 20. The mainboard 18 is disposed on the casing 20 and has at least one first connector 22 (for example, the first connector 22 may be a heavy duty connector or a power connector, and, as shown in FIG. 3, the mainboard 18 may have three first connectors 22, but the present disclosure is not limited thereto). The casing 20 has a first casing side-plate 24 and a second casing side-plate 26 opposite to the first casing side-plate 24. The first casing side-plate 24 has at least one pin 28 (for example, as shown in FIG. 4, the first casing side-plate 24 may have two pins 28, but the present disclosure is not limited thereto). The second casing side-plate 26 has a pin 30 corresponding to the pin 28. In one example, the electronic device 16 could be a mainboard (but the present disclosure is not limited thereto, that is, the present disclosure could adopt other type of electronic device, such as a heat-dissipating fan module) and has a second connector 32 corresponding to the first connector 22.

Figure 5:
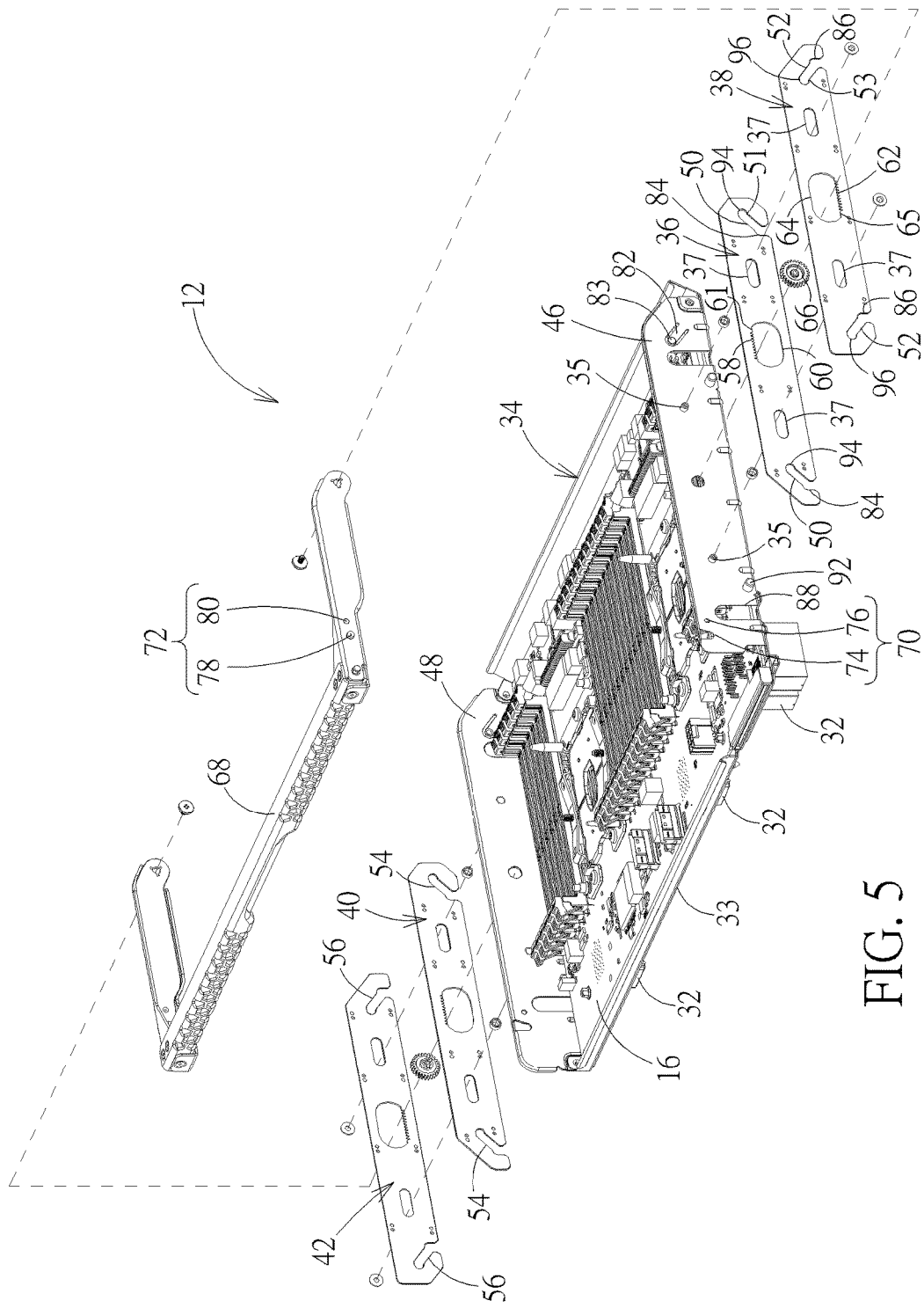
FIG. 5 is an exploded diagram of the tray mechanism in FIG. 2.

As shown in FIG. 2 and FIG. 5, the tray mechanism 12 includes a tray 34, a first sliding sheet 36, a second sliding sheet 38, a third sliding sheet 40, a fourth sliding sheet 42, and a driving mechanism 44. The tray 34 has a bottom plate 33, a first tray side-plate 46 corresponding to the first casing side-plate 24, and a second tray side-plate 48 corresponding to the second casing side-plate 26. The electronic device 16 is disposed on the bottom plate 33 of the tray 34. The first sliding sheet 36 is slidably disposed on the first tray side-plate 46 and has a first oblique slot 50 corresponding to the pin 28. A first bottom end portion 51 is formed at a side of the first oblique slot 50 away from the bottom plate 33 of the tray 34. The second sliding sheet 38 is slidably disposed on the first tray side-plate 46 and has a second oblique slot 52 corresponding to the pin 28 and the first oblique slot 50. The second oblique slot 52 intersects with the first oblique slot 50, that is, an oblique direction of the second oblique slot 52 is opposite to an oblique direction of the first oblique slot 50. A second bottom end portion 53 is formed at a side of the second oblique slot 52 away from the bottom plate 33 of the tray 34. The third sliding sheet 40 is slidably disposed on the second tray side-plate 48 and has a third oblique slot 54 corresponding to the pin 30. The fourth sliding sheet 42 is slidably disposed on the second tray side-plate 48 and has a fourth oblique slot 56 corresponding to the pin 30 and the third oblique slot 54. The third oblique slot 54 intersects with the fourth oblique slot 56, that is, an oblique direction of the third oblique slot 54 is opposite to an oblique direction of the fourth oblique slot 56.

In this embodiment, the first sliding sheet 36 and the second sliding sheet 38 could be slidably disposed on the first tray side-plate 46 and the third sliding sheet 40 and the fourth sliding sheet 42 could be slidably disposed on the second tray side-plate 48 by a pillar-to-slot sliding design, but the present disclosure is not limited thereto, meaning that the present disclosure could adopt other sliding design, such as a block-to-slot sliding design. For example, as shown in FIG. 5, the tray mechanism 12 could utilize at least one pillar 35 (for example, as shown in FIG. 5, the tray mechanism 12 may have two pillars 35, but the present disclosure is not limited thereto) to penetrate through transverse slots 37 on the first sliding sheet 36 and the second sliding sheet 38 for disposing the first sliding sheet 36 and the second sliding sheet 38 on the first tray side-plate 46 (e.g. by rivets or screws). In such a manner, when the pillar 35 slides along the transverse slot 37, the first sliding sheet 36 and the second sliding sheet 38 can slide transversely on the first tray side-plate 46.

The driving mechanism 44 is movably connected to the first sliding sheet 36, the second sliding sheet 38, the third sliding sheet 40, and the fourth sliding sheet 42, and is configured to slide the first sliding sheet 36 and the second sliding sheet 38 in the opposite directions on the first tray side-plate 46 and to slide the third sliding sheet 40 and the fourth sliding sheet 42 in the opposite directions on the second tray side-plate 48. In this embodiment, the driving mechanism 44 could adopt a gear-to-rack engaging design to slide the first sliding sheet 36 and the second sliding sheet 38 in the opposite directions on the first tray side-plate 46. To be more specific, as shown in FIG. 2 and FIG. 5, a first rack structure 58 and a first transverse slot 60 could be further formed on the first sliding sheet 36, and a second rack structure 62 and a second transverse slot 64 could be further formed on the second sliding sheet 38. The first rack structure 58 is formed on an upper wall 61 of the first transverse slot 60. The second rack structure 62 is formed on a lower wall 65 of the second transverse slot 64 and is opposite to the first rack structure 58. The driving mechanism 44 could include a gear 66 and a handle 68. The gear 66 is disposed in the first transverse slot 60 and the second transverse slot 64 and is engaged with the first rack structure 58 and the second rack structure 62 respectively. The handle 68 is connected to the gear 66 to move together with the gear 66 (for example, the gear 66 may be connected to the handle 68 by a shaft-to-hole fixing design) and is pivoted to the first tray side-plate 46 to be rotatable between a holding position and a folding position relative to the tray 34. The handle 68 could be pivoted to a lateral center of gravity of the tray 34 for lifting the tray 34 more steadily, but the present disclosure is not limited thereto. Accordingly, the driving mechanism 44 can slide the first sliding sheet 36 and the second sliding sheet 38 in the opposite directions on the first tray side-plate 46 via engagement of the gear 66 with the first rack structure 58 and the second rack structure 62 and rotation of the handle 68 relative to the first tray side-plate 46. The aforesaid gear driving design could be applied to the third sliding sheet 40 and the fourth sliding sheet 42 to slide the third sliding sheet 40 and the fourth sliding sheet 42 in the opposite directions on the second tray side-plate 48 with rotation of the handle 68, and the related description could be reasoned by analogy according to the aforesaid description and omitted herein.

In practical application, the first tray side-plate 46 could have a first positioning structure 70, and the handle 68 could have a second positioning structure 72 corresponding to the first positioning structure 70. Accordingly, when the handle 68 rotates to the folding position relative to the tray 34, the second positioning structure 72 is engaged with the first positioning structure 70 to position the handle 68 on the first tray side-plate 46. For example, as shown in FIG. 5, the first positioning structure 70 could include a limiting opening 74 and a positioning hole 76, and the second positioning structure 72 could include a limiting pillar 78 and a protruding point 80. Accordingly, when the limiting pillar 78 is engaged with the limiting opening 74 and the protruding point 80 is engaged with the positioning hole 76, the handle 68 can be positioned at the folding position steadily, so as to efficiently prevent the handle 68 from leaving the folding position, which results in separation of the electronic device 14 and the mainboard 18, when the server apparatus 10 receives external impact. On the other hand, the first tray side-plate 46 could have a positioning arm 82. The positioning arm 82 has a protruding end portion 83. As such, when the handle 68 is located at the holding position as shown in FIG. 2, the protruding end portion 83 is engaged with the first oblique slot 50 to position the first sliding sheet 36 at the disassembling position steadily.

As shown in FIGS. 1-5, a first guiding slot 84 extends downward from the first oblique slot 50, and a second guiding slot 86 extends downward from the second oblique slot 52. In such a manner, when the first sliding sheet 36 and the second sliding sheet 38 slide in the opposite directions on the first tray side-plate 46 to the disassembling position as shown in FIG. 2, the first guiding slot 84 is overlapped with the second guiding slot 86 to form a guiding opening 85, such that the pin 28 can abut against the first oblique slot 50 and the second oblique slot 52 through the guiding opening 85. Accordingly, the user can align the tray mechanism 12 with the mainboard device 14 quickly. Furthermore, a receiving slot 88 could be formed on the first tray side-plate 46 corresponding to the pin 28 for receiving the pin 28, so as to efficiently prevent jamming between the pin 28 and the first tray side-plate 46 during the process of assembling the tray mechanism 12 with the mainboard device 14. Moreover, as shown in FIG. 1 and FIG. 4, the first casing side-plate 24 could further have at least one guide rail 90 (for example, as shown in FIG. 4, the first casing side-plate 24 may have two guide rails 90, but the present disclosure is not limited thereto), and a positioning pillar 92 protrudes from the first tray side-plate 46 corresponding to the guide rail 90. As such, during the process of mounting the tray mechanism 12 into the mainboard device 14, the positioning pillar 92 can slide along the guide rail 90 to abut against a bottom of the guide rail 90, so as to position the tray mechanism 12 in the mainboard device 14 precisely. The aforesaid positioning and receiving structural designs could be applied to the third sliding sheet 40, the fourth sliding sheet 42, and the second tray side-plate 48, the aforesaid pillar-to-rail guiding design could be applied to the second casing side-plate 26 and the second tray side-plate 48, and the related description could be reasoned by analogy according to the aforesaid description and omitted herein.

More detailed description for the assembly operation of the server apparatus 10 is provided as follows. Please refer to FIG. 1, FIG. 6 and FIG. 7. When the user wants to perform the assembly operation of the server apparatus 10, the user just needs to hold the handle 68 to lift the tray mechanism 12 with the electronic device 16 mounted therein and then locate the tray mechanism 12 above the mainboard device 14. Subsequently, via guidance of the guide rail 90 and the positioning pillar 92 and guidance of the first guiding slot 84 and the second guiding slot 86, the user can place the tray mechanism 12 at a position where the pin 28 penetrates through and abuts against the first oblique slot 50 and the second oblique slot 52 and the pin 30 penetrates through and abuts against the third oblique slot 54 and the fourth oblique slot 56.

Figure 6:
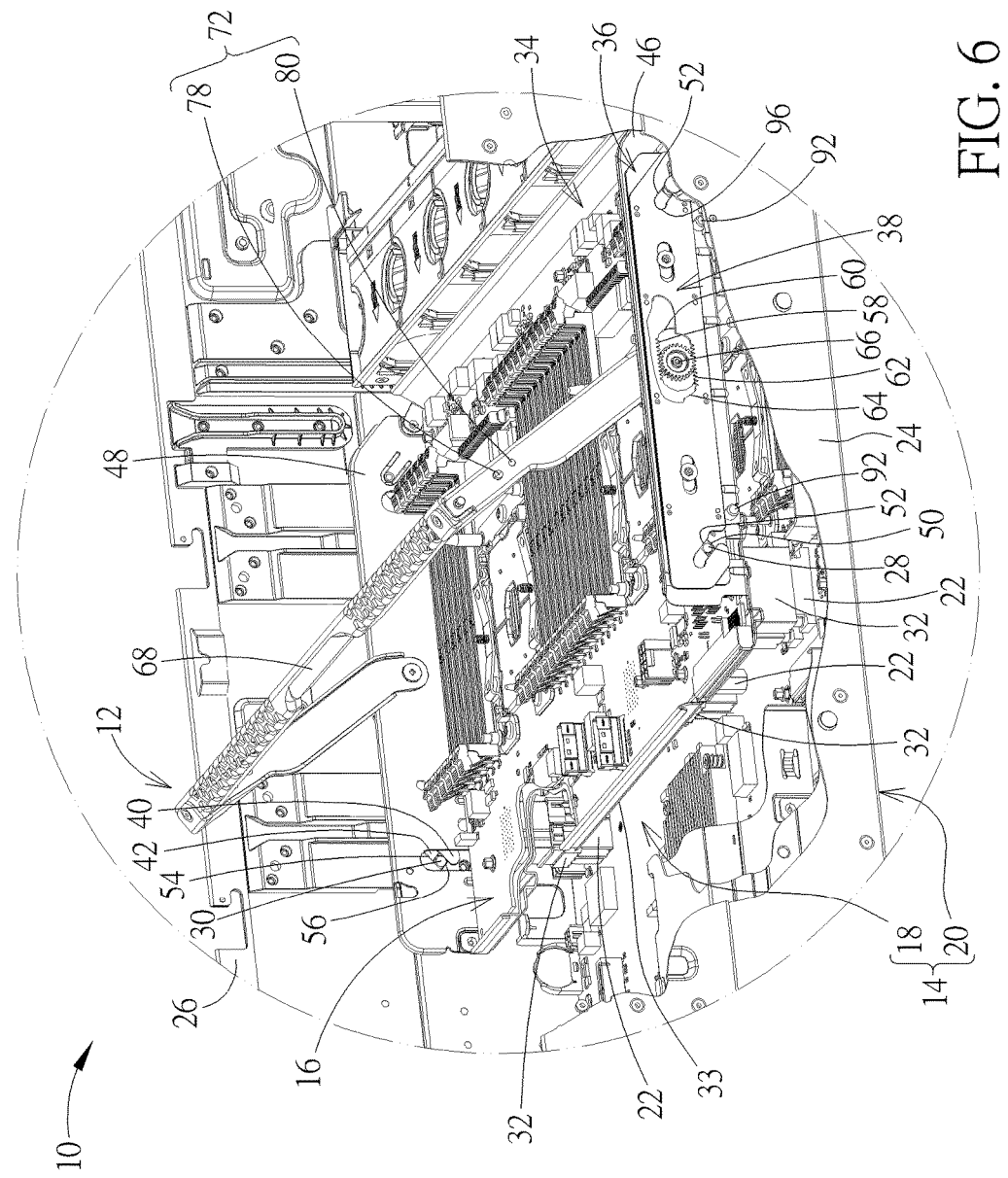
FIG. 6 is a partial enlarged diagram of a handle in FIG. 1 rotating downward relative to a tray.
Figure 7:
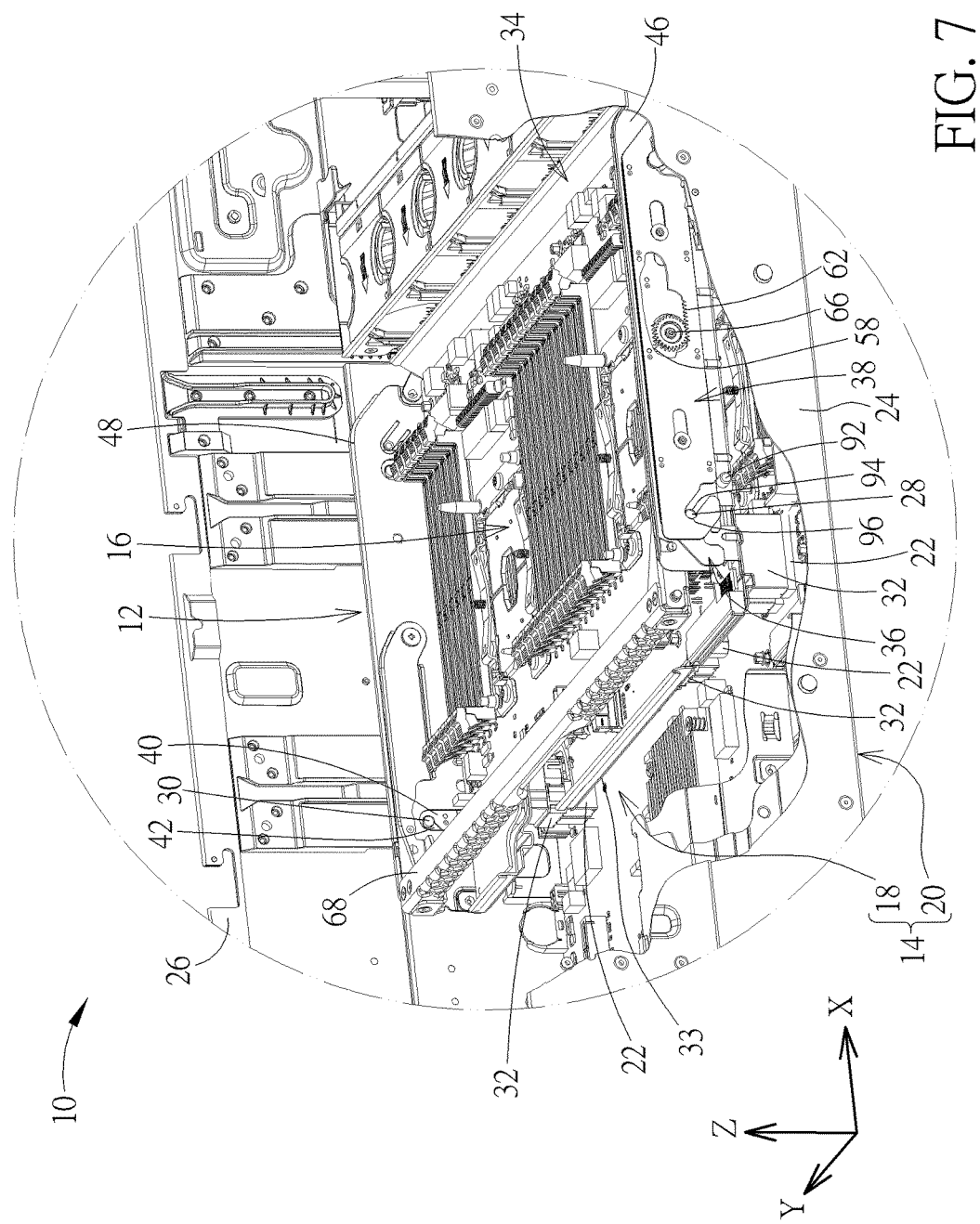
FIG. 7 is a partial enlarged diagram of the handle in FIG. 6 rotating to a folding position.

Subsequently, the user needs to pull the handle 68 from the holding position as shown in FIG. 1 downward to a position as shown in FIG. 6 and then to the folding position as shown in FIG. 7. During this process, the handle 68 rotates the gear 66 counterclockwise to slide the first rack structure 58 and the second rack structure 62 in the opposite directions from a position as shown in FIG. 1 to a position as shown in FIG. 6 and then to a position as shown in FIG. 7. As such, with sliding of the first rack structure 58 and the second rack structure 62, the first sliding sheet 36 and the second sliding sheet 38 slide in the opposite directions on the first tray side-plate 46 to the assembling position as shown in FIG. 7. At this time, with rotation of the handle 68, the third sliding sheet 40 and the fourth sliding sheet 42 also slide in the opposite directions on the second tray side-plate 48 to the assembling position as shown in FIG. 7. When the first sliding sheet 36 and the second sliding sheet 38 slide in the opposite directions on the first tray side-plate 46, the first oblique slot 50 and the second oblique slot 52 abut against the pin 28 and slide downwardly and obliquely from a position as shown in FIG. 1 to a position as shown in FIG. 6 and then to a position as shown in FIG. 7. Simultaneously, when the third sliding sheet 40 and the fourth sliding sheet 42 slide in the opposite directions on the second tray side-plate 48, the third oblique slot 54 and the fourth oblique slot 56 abut against the pin 30 and slide downwardly and obliquely from a position as shown in FIG. 1 to a position as shown in FIG. 6 and then to a position as shown in FIG. 7.

In such a manner, when the first sliding sheet 36 and the second sliding sheet 38 slide in the opposite directions and the third sliding sheet 40 and the fourth sliding sheet 42 slide in the opposite directions, the second connector 32 of the electronic device 16 is inserted into the first connector 22 via downward reaction force generated by the first oblique slot 50 and the second oblique slot 52 abutting against the pin 28 and the third oblique slot 54 and the fourth oblique slot 56 abutting against the pin 30. That is, the assembly process of mounting the electronic device 16 on the mainboard 18 can be completed by utilizing the handle 68 to rotate the gear 66 to drive the tray 34 downward to a position as shown in FIG. 7, and electrical connection between the electronic device 16 and the mainboard 18 can be established at the same time. At this time, the pin 28 penetrates through the first bottom end portion 51 of the first oblique slot 50 and the second bottom end portion 53 of the second oblique slot 52.

To be noted, in this embodiment, as shown in FIG. 5, a first limiting slot 94 extends horizontally from the first bottom end portion 51 of the first oblique slot 50, and a second limiting slot 96 extends horizontally from the second bottom end portion 53 of the first oblique slot 50. In such a manner, when the first sliding sheet 36 and the second sliding sheet 38 slide in the opposite directions on the first tray side-plate 46 to the assembling position as shown in FIG. 7, the first limiting slot 94 overlaps with the second limiting slot 96 to form a limiting opening (not shown) to constrain movement of the pin 28 in a "Z" direction relative to the first tray side-plate 46. Accordingly, the handle 68 can be positioned at the folding position more steadily. The aforesaid limiting slot design could be applied to the third sliding sheet 40 and the fourth sliding sheet 42, and the related description could be reasoned by analogy according to the aforesaid description and omitted herein.

On the other hand, when the user wants to perform the disassembly operation of the server apparatus 10, the user just needs to pull the handle 68 upward from the folding position as shown in FIG. 7 to the position as shown in FIG. 6 and then to the holding position as shown in FIG. 1. During this process, the handle 68 rotates the gear 66 clockwise to slide the first rack structure 58 and the second rack structure 62 in the opposite directions from the position as shown in FIG. 7 to the position as shown in FIG. 6 and then to the position as shown in FIG. 1. As such, with sliding of the first rack structure 58 and the second rack structure 62, the first sliding sheet 36 and the second sliding sheet 38 slide in the opposite directions on the first tray side-plate 46 to the disassembling position as shown in FIG. 1. With rotation of the handle 68, the third sliding sheet 40 and the fourth sliding sheet 42 slide in the opposite directions on the second tray side-plate 48 to the disassembling position as shown in FIG. 1. When the first sliding sheet 36 and the second sliding sheet 38 slide in the opposite directions on the first tray side-plate 46, the first oblique slot 50 and the second oblique slot 52 abut against the pin 28 and slide upwardly and obliquely from the position as shown in FIG. 7 to the position as shown in FIG. 6 and then to the position as shown in FIG. 1. Simultaneously, when the third sliding sheet 40 and the fourth sliding sheet 42 slide in the opposite directions on the second tray side-plate 48, the third oblique slot 54 and the fourth oblique slot 56 abut against the pin 30 and slide upwardly and obliquely from the position as shown in FIG. 7 to the position as shown in FIG. 6 and then to the position as shown in FIG. 1.

In such a manner, when the first sliding sheet 36 and the second sliding sheet 38 slide in the opposite directions and the third sliding sheet 40 and the fourth sliding sheet 42 slide in the opposite directions, the second connector 32 of the electronic device 16 is detached from the first connector 22 via upward reaction force generated by the first oblique slot 50 and the second oblique slot 52 abutting against the pin 28 and the third oblique slot 54 and the fourth oblique slot 56 abutting against the pin 30. That is, by utilizing the handle 68 to rotate the gear 66 to drive the tray 34 upward to a position as shown in FIG. 1, the disassembly process of detaching the tray mechanism 12 from the mainboard device 14 can be completed quickly and effortlessly for the user to perform the subsequent replacing or maintenance operation.

In summary, the present disclosure adopts the design that the driving mechanism formed by the handle, the gear and the rack structures drives the sliding sheets on the tray side-plate to exert force upon the pin on the casing side-plate, to help the user mount the electronic device on the mainboard or detach the electronic device from the mainboard quickly and effortlessly via the aforesaid simple handle rotating operations. In such a manner, the present disclosure can solve the problem in the prior art that it is not easy to plug or unplug the connectors on the stacked mainboards, so as to greatly improve operational convenience of the server apparatus in assembly and disassembly of the mainboards.

It should be mentioned that the present disclosure can adopt the design that the sliding sheets and the driving mechanism are only disposed at one side of the server apparatus for simplifying the driving mechanical design of the server apparatus. For example, in another embodiment, the sliding sheets and the driving mechanism could be only disposed at the casing side-plate adjacent to the connector of the mainboard and the corresponding tray side-plate, so that the user can complete the assembly process of mounting the electronic device on the mainboard and the disassembly process of detaching the electronic device from the mainboard quickly and effortlessly via simple one-side driving operation. As for the related description for this embodiment, it could be reasoned by analogy according to the aforesaid embodiment and omitted herein. To be noted, in the embodiment that the driving mechanism is omitted and there is no need to electrically connect the electronic device to the mainboard, the present disclosure can only adopt the design that the pin simultaneously penetrates through the first bottom end portion and the second bottom end portion overlapped with each other when the first sliding sheet and the second sliding sheet are located at the assembling position, to assemble the electronic device with the mainboard device.

Figure 8:
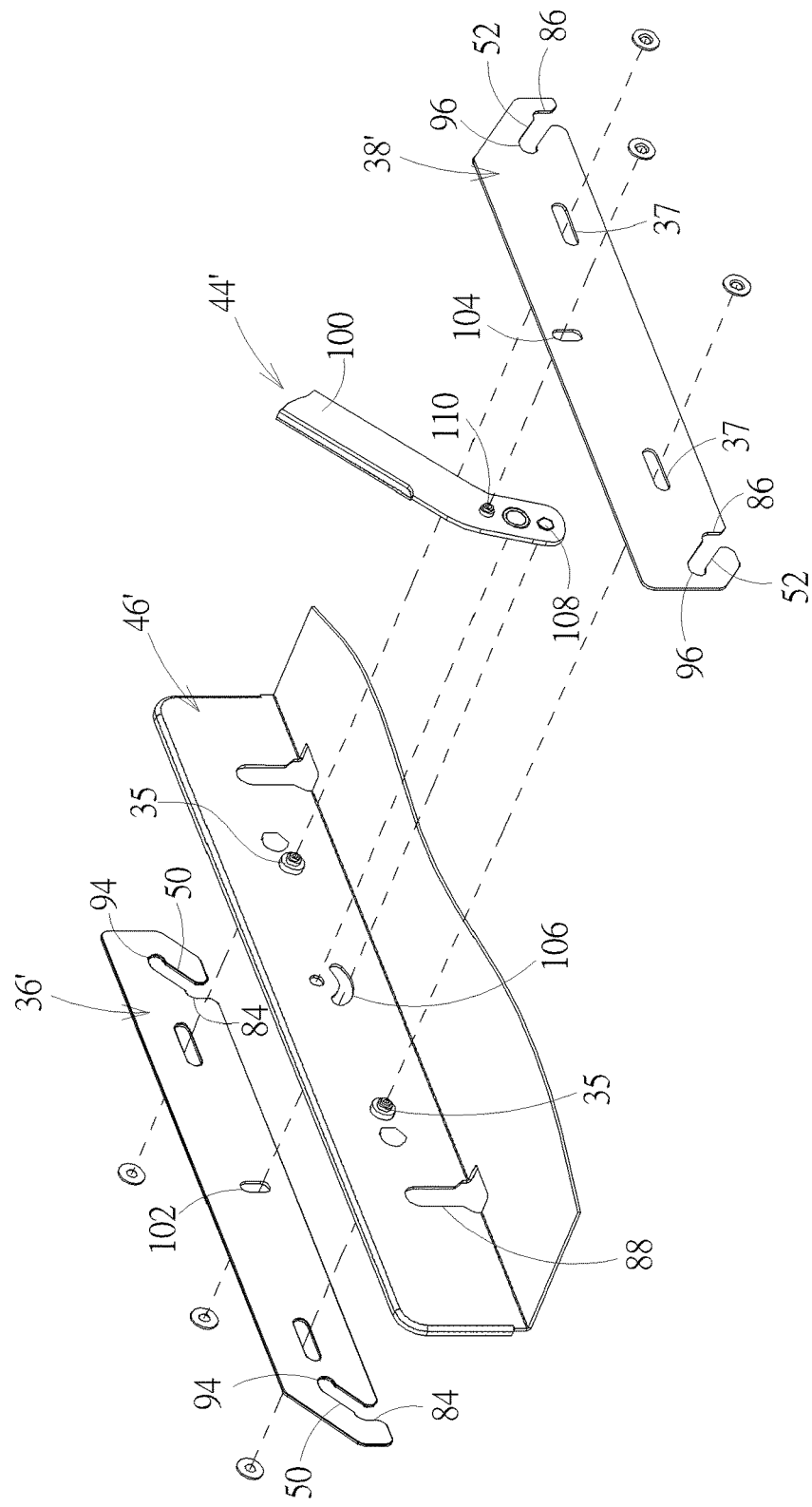
FIG. 8 is an exploded diagram of a driving mechanism, a first sliding sheet, a second sliding sheet and a first tray side-plate according to another embodiment of the present disclosure.
Figure 9:
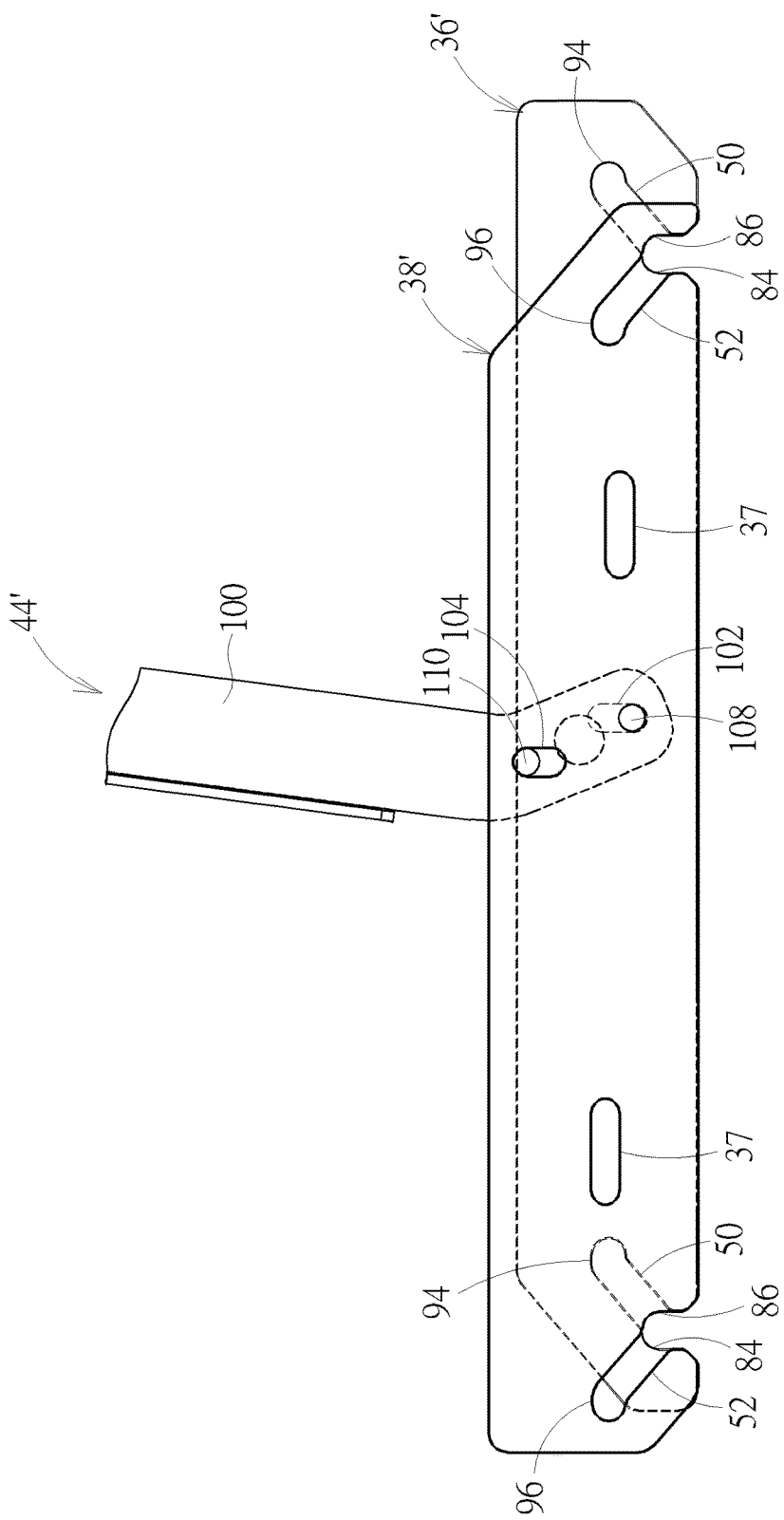
FIG. 9 is a diagram of a handle in FIG. 8 being located at a holding position.
Figure 10:
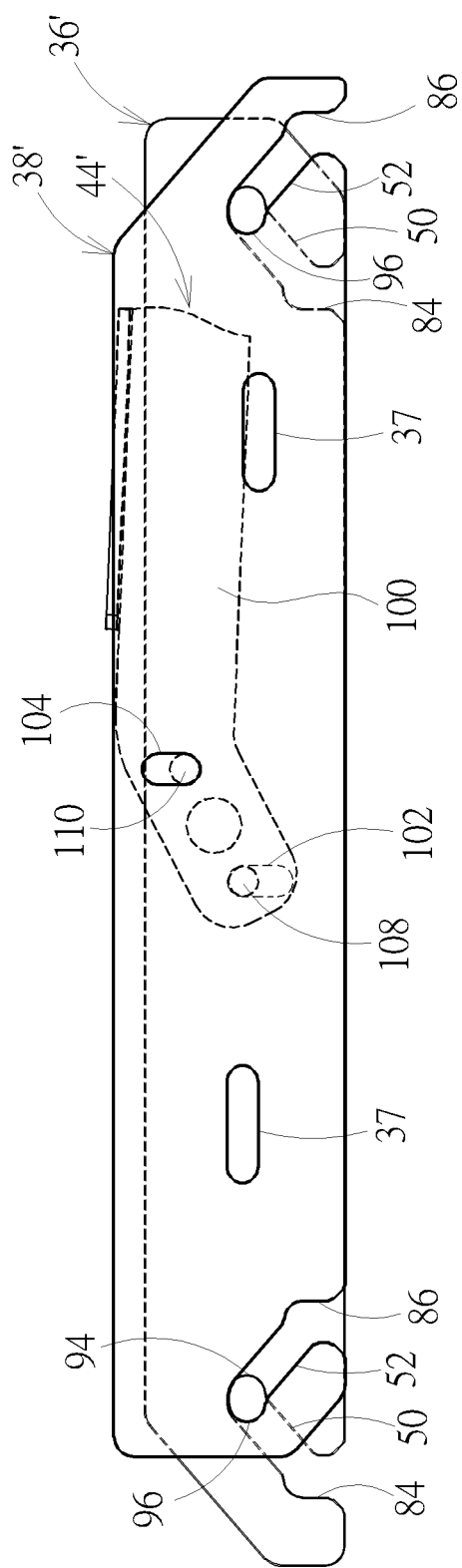
FIG. 10 is a diagram of the handle in FIG. 9 rotating to a folding position.

Furthermore, the design of the driving mechanism is not limited to the aforesaid embodiment. For example, please refer to FIG. 8, FIG. 9, and FIG. 10. Components both mentioned in this embodiment and the aforesaid embodiment represent components with similar structures or functions, and the related description is omitted herein. As shown in FIG. 8, FIG. 9, and FIG. 10, a driving mechanism 44' includes a handle 100, a first sliding sheet 36' has the first oblique slot 50 and a first longitude slot 102, and a second sliding sheet 38' has the second oblique slot 52 and a second longitude slot 104. The first sliding sheet 36' and the second sliding sheet 38' are located at two sides of a first tray side-plate 46' respectively. An arc-shaped slot 106 is formed on the first tray side-plate 46' corresponding to the first longitude slot 102. The handle 100 is pivoted to the first tray side-plate 46' and has a first pillar 108 protruding toward the first longitude slot 102 and a second pillar 110 protruding toward the second longitude slot 104. The first pillar 108 penetrates through the arc-shaped slot 106 and is movably disposed through the first longitude slot 102. The second pillar 110 is movably disposed through the second longitude slot 104.

Via the aforesaid design, when the handle 100 rotates from the holding position as shown in FIG. 9 downward to the folding position as shown in FIG. 10, with rotation of the handle 100, the first pillar 108 and the second pillar 110 slide in the opposite directions along the first longitude slot 102 and the second longitude slot 104 respectively, to slide the first sliding sheet 36' and the second sliding sheet 38' in the opposite directions on the first tray side-plate 46' to the assembling position as shown in FIG. 10. Accordingly, the assembly process of mounting the electronic device 16 on the mainboard 18 can be completed. On the other hand, when the handle 100 rotates from the folding position as shown in FIG. 10 upward to the holding position as shown in FIG. 9, with rotation of the handle 100, the first pillar 108 and the second pillar 110 slide in the opposite directions along the first longitude slot 102 and the second longitude slot 104 respectively, to drive the first sliding sheet 36' and the second sliding sheet 38' to slide in the opposite directions on the first tray side-plate 46' to the disassembling position as shown in FIG. 9. Accordingly, the disassembly process of detaching the tray mechanism 12 from the mainboard device 14 can be completed. As for other related description for this embodiment, it could be reasoned by analogy according to the aforesaid embodiment and omitted herein.

Figure 11:
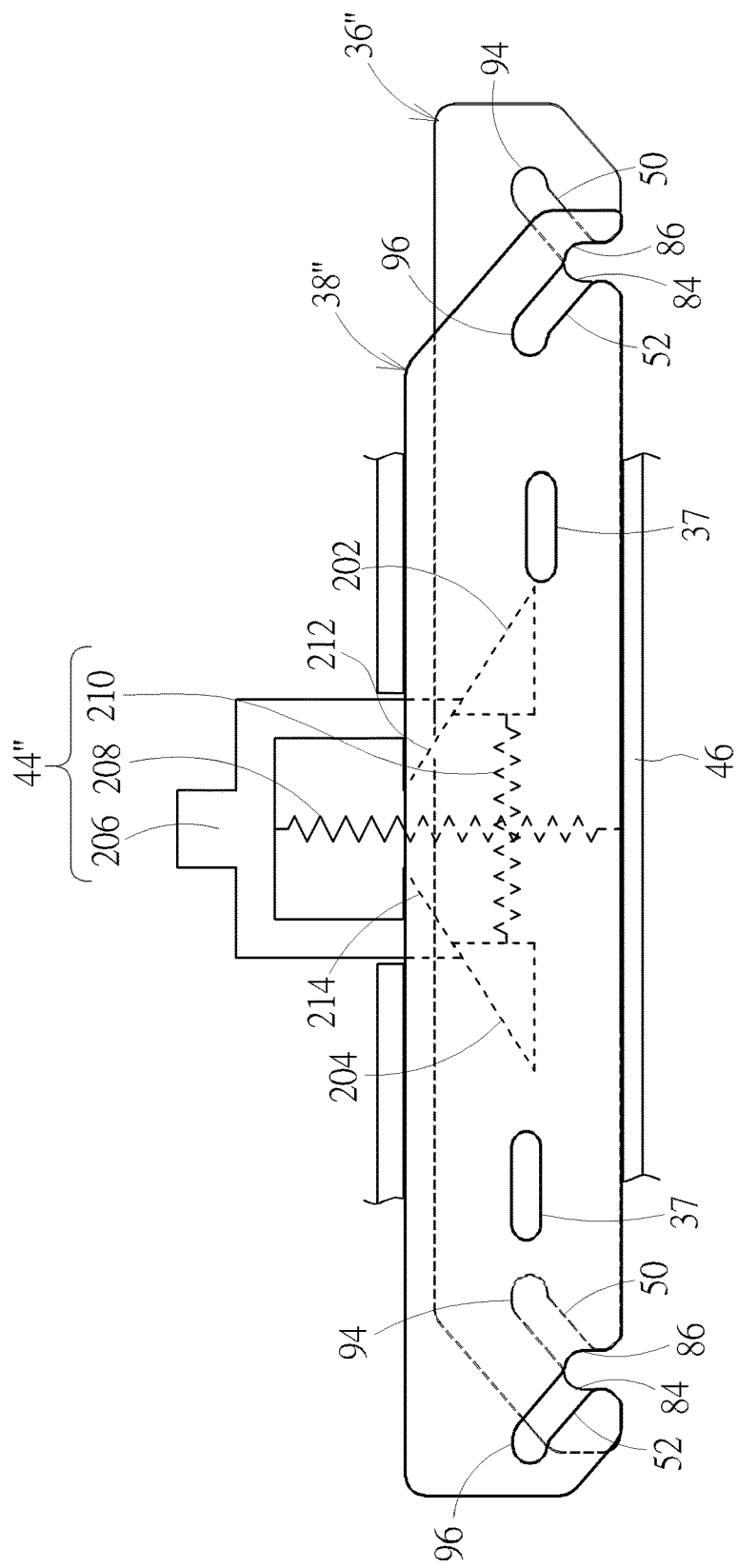
FIG. 11 is an assembly diagram of a driving mechanism being assembled with a first sliding sheet, a second sliding sheet and the first tray side-plate according to another embodiment of the present disclosure.

Moreover, the present disclosure can adopt the button driving design. For example, please refer to FIG. 11, which is an assembly diagram of a driving mechanism 44" being assembled with a first sliding sheet 36", a second sliding sheet 38" and a first tray side-plate 46 according to another embodiment of the present disclosure. Components both mentioned in this embodiment and the aforesaid embodiments represent components with similar structures or functions, and the related description is omitted herein. As shown in FIG. 11, the first sliding sheet 36" has the first oblique slot 50 and a first inclined-surface structure 202, the second sliding sheet 38" has the second oblique slot 52 and a second inclined-surface structure 204 opposite to the first inclined-surface structure 202, and the driving mechanism 44" includes a button member 206, a first spring 208, and a second spring 210. The button member 206 is movably disposed on the first tray side-plate 46 (e.g. by a block-to-slot sliding design) and has a third inclined-surface structure 212 and a fourth inclined-surface structure 214. The third inclined-surface structure 212 is in contact with the first inclined-surface structure 202 in a surface-to-surface manner. The fourth inclined-surface structure 214 is in contact with the second inclined-surface structure 204 in a surface-to-surface manner. The first spring 208 is connected to the button member 206 and the first tray side-plate 46 and is configured to drive the button member 206 back to a non-pressed position as shown in FIG. 11. The second spring 210 is connected to the first inclined-surface structure 202 and the second inclined-surface structure 204 and is configured to drive the first sliding sheet 36" and the second sliding sheet 38" back to the disassembling position.

Via the aforesaid design, when the button member 206 is pressed, the third inclined-surface structure 212 and the fourth inclined-surface structure 214 slide downwardly and obliquely along the first inclined-surface structure 202 and the second inclined-surface structure 204, to drive the first sliding sheet 36" and the second sliding sheet 38" to slide in the opposite directions on the first tray side-plate 46 to the assembling position. Accordingly, the assembly process of mounting the electronic device 16 on the mainboard 18 can be completed. On the other hand, when the button member 206 is released to the non-pressed position as shown in FIG. 11, the third inclined-surface structure 212 and the fourth inclined-surface structure 214 slide upwardly and obliquely along the first inclined-surface structure 202 and the second inclined-surface structure 204, to drive the first sliding sheet 36" and the second sliding sheet 38" to slide in the opposite directions on the first tray side-plate 46 to the disassembling position. Accordingly, the disassembly process of detaching the tray mechanism 12 from the mainboard device 14 can be completed. As for other related description for this embodiment, it could be reasoned by analogy according to the aforesaid embodiments and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A tray mechanism for mounting at least one electronic device on a mainboard device, the mainboard device comprising a mainboard and a casing, the mainboard being disposed in the casing, a casing side-plate of the casing having at least one pin, the tray mechanism comprising:
    a tray having a bottom plate and a tray side-plate corresponding to the casing side-plate, the at least one electronic device being disposed on the bottom plate;
    a first sliding sheet slidably disposed on the tray side-plate, a first oblique slot being formed on the first sliding sheet corresponding to the at least one pin, a first bottom end portion being formed at a side of the first oblique slot away from the bottom plate; and
    a second sliding sheet slidably disposed on the tray side-plate, a second oblique slot being formed on the second sliding sheet corresponding to the at least one pin and intersecting with the first oblique slot, a second bottom end portion being formed at a side of the second oblique slot away from the bottom plate;
    wherein when the first and second sliding sheets are located at an assembling position, the at least one pin penetrates through the first and second bottom end portions simultaneously.

2. The tray mechanism of claim 1, wherein the mainboard has at least one first connector, the at least one electronic device has at least one second connector corresponding to the at least one first connector;
    wherein the first sliding sheet and the second sliding sheet slide in the opposite directions between a disassembling position and the assembling position on the tray side-plate;
    when the at least one pin penetrates through the first and second oblique slots, and the first sliding sheet and the second sliding sheet slide in the opposite directions to the assembling position, the first oblique slot and the second oblique slot abut against the at least one pin respectively to slide obliquely and downwardly and drive the tray to move downwardly to insert the second connector of the at least one electronic device into the at least one first connector.

3. The tray mechanism of claim 2 further comprising:
    a driving mechanism movably connected to the first sliding sheet and the second sliding sheet, the driving mechanism being configured to drive the first sliding sheet and the second sliding sheet to slide in the opposite directions between the assembling position and the disassembling position;
    wherein when the driving mechanism drives the first sliding sheet and the second sliding sheet to slide in the opposite directions to the assembling position, the first oblique slot and the second oblique slot abut against the at least one pin respectively and move obliquely and downwardly.

4. The tray mechanism of claim 3, wherein a first rack structure and a first transverse slot are further formed on the first sliding sheet, the first rack structure is formed on an upper wall of the first transverse slot, a second rack structure and a second transverse slot are formed on the second sliding sheet, the second rack structure is formed on a lower wall of the second transverse slot and is opposite to the first rack structure, and the driving mechanism comprises:
    a gear disposed in the first transverse slot and the second transverse slot and engaged with the first rack structure and the second rack structure respectively; and
    a handle connected to the gear and pivoted to the tray side-plate to be rotatable between a holding position and a folding position relative to the tray;
    wherein when the handle rotates from the holding position downward to the folding position relative to the tray, the handle rotates the gear to drive the first rack structure and the second rack structure to slide in the opposite directions, to slide the first sliding sheet and the second sliding sheet in the opposite directions to the assembling position on the tray side-plate.

5. The tray mechanism of claim 4, wherein the tray side-plate has a first positioning structure, a second positioning structure is formed on the handle corresponding to the first positioning structure, and when the handle rotates to the folding position relative to the tray, the second positioning structure is engaged with the first positioning structure to position the handle on the tray side-plate.

6. The tray mechanism of claim 3, wherein a first longitude slot is further formed on the first sliding sheet, a second longitude slot is formed on the second sliding sheet, the first sliding sheet and the second sliding sheet are located at two sides of the tray side-plate respectively, an arc-shaped slot is formed on the tray side-plate corresponding to the first longitude slot, and the driving mechanism comprises:
a handle pivoted to the tray side-plate to be rotatable between a holding position and a folding position relative to the tray, a first pillar protruding from the handle toward the first longitude slot, a second pillar protruding from the handle toward the second longitude slot, the first pillar penetrating through the arc-shaped slot and being movably disposed through the first longitude slot, the second pillar being movably disposed through the second longitude slot;
wherein when the handle rotates from the holding position downward to the folding position relative to the tray, the first pillar and the second pillar slide in the opposite directions along the first longitude slot and the second longitude slot respectively, to drive the first sliding sheet and the second sliding sheet to slide to the assembling position in the opposite directions on the tray side-plate.

7. The tray mechanism of claim 3, wherein the first sliding sheet has a first inclined-surface structure, the second sliding sheet has a second inclined-surface structure opposite to the first inclined-surface structure, and the driving mechanism comprises:
a button member movably disposed on the tray side-plate and having a third inclined-surface structure and a fourth inclined-surface structure, the third inclined-surface structure being in contact with the first inclined-surface structure in a surface-to-surface manner, and the fourth inclined-surface structure being in contact with the second inclined-surface structure in a surface-to-surface manner;
a first spring connected to the button member and the tray side-plate for driving the button member back to a non-pressed position; and
a second spring connected to first inclined-surface structure and the second inclined-surface structure for driving the first sliding sheet and the second sliding sheet from the assembling position back to the disassembling position;
when the button member is pressed, the third inclined-surface structure slides obliquely and downwardly along the first inclined-surface structure and the fourth inclined-surface structure slides obliquely and downwardly along the second inclined-surface structure, to drive the first sliding sheet and the second sliding sheet to slide to the assembling position in the opposite directions on the tray side-plate.

8. The tray mechanism of claim 1, wherein the tray side-plate has a positioning arm, the positioning arm has a protruding end portion, and when the first sliding sheet and the second sliding sheet are located at a disassembling position, the protruding end portion is engaged with the first oblique slot to position the first sliding sheet at the disassembling position.

9. The tray mechanism of claim 1, wherein a first guiding slot and a second guiding slot extend downward from the first oblique slot and the second oblique slot respectively; when the first sliding sheet and the second sliding sheet slide to a disassembling position in the opposite directions on the tray side-plate, the first guiding slot is overlapped with the second guiding slot to form a guiding opening and the at least one pin abuts against the first oblique slot and the second oblique slot through the guiding opening; a first limiting slot extends horizontally from the first oblique slot and a second limiting slot extends horizontally from the second oblique slot; when the first sliding sheet and the second sliding sheet slide to the assembling position in the opposite directions on the tray side-plate, the first limiting slot and the second limiting slot are overlapped with each other to clamp the at least one pin cooperatively and to constrain movement of the at least one pin relative to the tray side-plate.

10. The tray mechanism of claim 1, wherein the casing side-plate further has at least one guide rail, a positioning pillar protrudes from the tray side-plate corresponding to the at least one guide rail, and the positioning pillar slides along the at least one guide rail to guide the tray to move upward and downward in the casing.

11. A tray mechanism comprising:
a tray having a bottom plate and a tray side-plate, at least one electronic device being disposed on the bottom plate;
a first sliding sheet slidably disposed on the tray side-plate, a first oblique slot being formed on the first sliding sheet, a first bottom end portion being formed at a side of the first oblique slot away from the bottom plate; and
a second sliding sheet slidably disposed on the tray side-plate, a second oblique slot being formed on the second sliding sheet corresponding to the first sliding slot and intersecting with the first oblique slot, a second bottom end portion being formed at a side of the second oblique slot away from the bottom plate;
wherein when the first and second sliding sheets are located at an assembling position, the first bottom end portion is overlapped with the second bottom end portion.

12. A server apparatus, comprising:
a mainboard device comprising a mainboard and a casing, the mainboard being disposed in the casing, a casing side-plate of the casing having at least one pin;
at least one electronic device; and
a tray mechanism comprising:
a tray having a bottom plate and a tray side-plate corresponding to the casing side-plate, the at least one electronic device being disposed on the bottom plate;
a first sliding sheet slidably disposed on the tray side-plate, a first oblique slot being formed on the first sliding sheet corresponding to the at least one pin, a first bottom end portion being formed at a side of the first oblique slot away from the bottom plate; and
a second sliding sheet slidably disposed on the tray side-plate, a second oblique slot being formed on the second sliding sheet corresponding to the at least one pin and intersecting with the first oblique slot, a second bottom end portion being formed at aside of the second oblique slot away from the bottom plate;
wherein when the first and second sliding sheets are located at an assembling position, the at least one pin penetrates through the first and second bottom end portions simultaneously.

13. The server apparatus of claim 12, wherein the mainboard has at least one first connector, the at least one electronic device has at least one second connector corresponding to the at least one first connector;
wherein the first sliding sheet and the second sliding sheet slide in the opposite directions between a disassembling position and the assembling position on the tray side-plate;
when the at least one pin penetrates through the first and second oblique slots and the first sliding sheet and the second sliding sheet slide in the opposite directions to the assembling position, the first oblique slot and the second oblique slot abut against the at least one pin respectively to slide obliquely and downwardly and drive the tray to move downwardly to insert the second connector of the at least one electronic device into the at least one first connector.

14. The server apparatus of claim 13, wherein the tray mechanism further comprises:
a driving mechanism movably connected to the first sliding sheet and the second sliding sheet, the driving mechanism being configured to drive the first sliding sheet and the second sliding sheet to slide in the opposite directions between the assembling position and the disassembling position;
wherein when the driving mechanism drives the first sliding sheet and the second sliding sheet to slide in the opposite directions to the assembling position, the first oblique slot and the second oblique slot abut against the at least one pin respectively and move obliquely and downwardly.

15. The server apparatus of claim 14, wherein a first rack structure and a first transverse slot are further formed on the first sliding sheet, the first rack structure is formed on an upper wall of the first transverse slot, a second rack structure and a second transverse slot are formed on the second sliding sheet, the second rack structure is formed on a lower wall of the second transverse slot and is opposite to the first rack structure, and the driving mechanism comprises:
a gear disposed in the first transverse slot and the second transverse slot and engaged with the first rack structure and the second rack structure respectively; and
a handle connected to the gear and pivoted to the tray side-plate to be rotatable between a holding position and a folding position relative to the tray;
wherein when the handle rotates from the holding position downward to the folding position relative to the tray, the handle rotates the gear to drive the first rack structure and the second rack structure to slide in the opposite directions, to slide the first sliding sheet and the second sliding sheet in the opposite directions to the assembling position on the tray side-plate.

16. The server apparatus of claim 15, wherein the tray side-plate has a first positioning structure, a second positioning structure is formed on the handle corresponding to the first positioning structure, and when the handle rotates to the folding position relative to the tray, the second positioning structure is engaged with the first positioning structure to position the handle on the tray side-plate.

17. The server apparatus of claim 14, wherein a first longitude slot is further formed on the first sliding sheet, a second longitude slot is formed on the second sliding sheet, the first sliding sheet and the second sliding sheet are located at two sides of the tray side-plate respectively, an arc-shaped slot is formed on the tray side-plate corresponding to the first longitude slot, and the driving mechanism comprises:
a handle pivoted to the tray side-plate to be rotatable between a holding position and a folding position relative to the tray, a first pillar protruding from the handle toward the first longitude slot, a second pillar protruding from the handle toward the second longitude slot, the first pillar penetrating through the arc-shaped slot and being movably disposed through the first longitude slot, the second pillar being movably disposed through the second longitude slot;
wherein when the handle rotates from the holding position downward to the folding position relative to the tray, the first pillar and the second pillar slide in the opposite directions along the first longitude slot and the second longitude slot respectively, to drive the first sliding sheet and the second sliding sheet to slide to the assembling position in the opposite directions on the tray side-plate.

18. The server apparatus of claim 14, wherein the first sliding sheet has a first inclined-surface structure, the second sliding sheet has a second inclined-surface structure opposite to the first inclined-surface structure, and the driving mechanism comprises:
a button member movably disposed on the tray side-plate and having a third inclined-surface structure and a fourth inclined-surface structure, the third inclined-surface structure being in contact with the first inclined-surface structure in a surface-to-surface manner, the fourth inclined-surface structure being in contact with the second inclined-surface structure in a surface-to-surface manner;
a first spring connected to the button member and the tray side-plate for driving the button member back to a non-pressed position; and
a second spring connected to first inclined-surface structure and the second inclined-surface structure for driving the first sliding sheet and the second sliding sheet from the assembling position back to the disassembling position;
when the button member is pressed, the third inclined-surface structure slides obliquely and downwardly along the first inclined-surface structure and the fourth inclined-surface structure slides obliquely and downwardly along the second inclined-surface structure, to drive the first sliding sheet and the second sliding sheet to slide to the assembling position in the opposite directions on the tray side-plate.

19. The server apparatus of claim 12, wherein a first guiding slot and a second guiding slot extend downward from the first oblique slot and the second oblique slot respectively; when the first sliding sheet and the second sliding sheet slide to a disassembling position in the opposite directions on the tray side-plate, the first guiding slot is overlapped with the second guiding slot to form a guiding opening and the at least one pin abuts against the first oblique slot and the second oblique slot through the guiding opening; a first limiting slot extends horizontally from the first oblique slot and a second limiting slot extends horizontally from the second oblique slot; when the first sliding sheet and the second sliding sheet slide to the assembling position in the opposite directions on the tray side-plate, the first limiting slot and the second limiting slot are overlapped with each other to clamp the at least one pin cooperatively and constrain movement of the at least one pin relative to the tray side-plate.

20. The server apparatus of claim 12, wherein the casing side-plate further has at least one guide rail, a positioning pillar protrudes from the tray side-plate corresponding to the at least one guide rail, and the positioning pillar slides along the at least one guide rail to guide the tray to move upward and downward in the casing.

* * * * *